United States Patent [19]

Fujita et al.

[11] 4,358,522

[45] Nov. 9, 1982

[54] DRY PLANOGRAPHIC PRINTING PLATE

[75] Inventors: Takashi Fujita, Kusatsu; Masao Iwamoto, Ohtsu, both of Japan

[73] Assignee: Toray Industries Incorporated, Tokyo, Japan

[21] Appl. No.: 293,478

[22] Filed: Aug. 17, 1981

Related U.S. Application Data

[63] Continuation of Ser. No. 87,760, Oct. 24, 1979, abandoned.

[30] Foreign Application Priority Data

Oct. 26, 1978 [JP] Japan ................... 53-131797
Feb. 19, 1979 [JP] Japan ................... 54-17263

[51] Int. Cl.$^3$ ............ G03C 1/54; G03C 1/60; G03F 7/08
[52] U.S. Cl. ................... 430/166; 430/190; 430/303
[58] Field of Search .............. 430/166, 190, 303

[56] References Cited

U.S. PATENT DOCUMENTS

| 3,046,120 | 7/1962 | Schmidt et al. | 430/190 |
| 3,511,178 | 5/1970 | Curtin | 430/303 |
| 3,635,709 | 1/1972 | Kobayashi | 430/190 |
| 3,759,711 | 9/1973 | Rauner et al. | 430/190 |
| 3,859,099 | 1/1975 | Petropoulos et al. | 430/190 |
| 3,945,830 | 3/1976 | Yazawa et al. | 430/303 |
| 3,953,212 | 4/1976 | Miyano et al. | 430/303 |

FOREIGN PATENT DOCUMENTS

| 45-9610 | 4/1970 | Japan | 430/190 |
| 1227602 | 4/1971 | United Kingdom | 430/190 |
| 1444381 | 7/1976 | United Kingdom | 430/303 |
| 213576 | 5/1968 | U.S.S.R. | 430/190 |

Primary Examiner—Charles L. Bowers, Jr.
Attorney, Agent, or Firm—Scully, Scott, Murphy and Presser

[57] ABSTRACT

Provided is a presensitized planographic printing plate requiring no dampening water for use in negative work which comprises a base substrate, a photosensitive layer secured to and overlying the base substrate, and containing an orthoquinonediazide compound and having a content of ethanol-soluble component not higher than 20% by weight, and a silicone rubber layer overlying the photosensitive layer through bonding component. When the printing plate is exposed through a negative film and then treated with a developer, the photosensitive layer in the exposed image areas is dissolved and the corresponding portion of the silicone rubber layer is also removed easily and is obtained image as an exact reproduction of the negative film. Dampening water is not required when printing is carried out.

6 Claims, No Drawings

DRY PLANOGRAPHIC PRINTING PLATE

This is a continuation of application Ser. No. 087,760, filed Oct. 24, 1979, now abandoned.

BACKGROUND OF THE INVENTION

This invention relates to a dry planographic printing plate and more particularly to a negative working presensitized planographic printing plate for use in dry planography affording a remarkably improved developing performance.

In the conventional planographic offset printing it is known that the function as image area and non-image area is imparted by different surface-chemical properties (oleophilic and hydrophilic properties) of each area formed image-wise on the surface of a printing plate, and dampening water fed to the non-image area forms a water film and acts as an ink repellent layer. Such planographic offset printing is widely used at present because it has the advantage that printing plate making is relatively easy and printed matters therefrom have high quality for its cost. However, the use of dampening water as an essential condition causes the following problems: (a) Maintaining the ink-water balance is difficult and requires skill, which impedes power-saving and automation. (b) When printing is started (also when printing is re-started after interval), it is required to print a large number of sheets until the ink-water balance becomes stable, so the spoilage rate is high. (c) Paper undergoes expansion and contraction due to the presence of water, and this easily causes a bad register. (d) Due to the emulsification of ink by dampening water, there arises problem both in dot reproducibility and in color reproducibility. (e) The printing press should be provided with a dampening system. As a result it becomes larger in size.

To solve these problems fundamentally there have been made various studies on dry planographic printing plates utilizing a silicone rubber layer as an ink-repellent layer. These printing plates are broadly classified into the following two, a dry planographic printing plate of silicone rubber underlying a photosensitive layer and a dry planographic printing plate of silicone rubber overlying a photosensitive layer. But the former has the following fundamental drawbacks.

Applying a photosensitive substance onto a silicone layer in a satisfactory manner is impossible by conventional coating methods in view of the intrinsic, water- and/or oil-repellent property of silicone rubber (which conversely is utilized as an ink-repellent layer). Therefore, it is necessary to adopt a method in which a photosensitive substance applied onto a separately prepared polymer film is pressure-bonded onto a silicone layer formed on a base substrate. But such method is troublesome in point of manufacturing process as compared with the conventional coating method, besides, such method easily causes a defect on the plate surface due to the presence of a foreign matter such as dust or air bubble between bonded layers. Furthermore, the image area formed on the silicone layer which is a so-called release layer comes off easily by an external force exerted thereon at the time of printing, and this tendency is remarkable specially in small dot image areas. Therefore, such a planographic printing plate of silicone rubber underlying a photosensitive layer cannot have a sufficient durability of printing a good printed matter of 133 or 150 lines in dot formation.

In the case of using the latter, dry planographic plate of silicone rubber overlying a photosensitive layer, for negative working, it is necessary to choose a positive photosensitive substance, namely a photosolubilizable substance as a photosensitive layer. When this plate is exposed to light, the photosensitive layer of the exposed area undergoes photolysis, becoming soluble in a developer, and is removed together with the silicone rubber layer, so the exposed area is now an image area. As an example of such a photosensitive layer, U.S. Pat. No. 3,511,178 discloses the use of diazonium salt. In general, however, diazonium salt is inferior in thermal stability, so it is difficult to manufacture a plate which exhibits stable performances.

There also is well known a photosensitive layer comprising an orthoquinonediazide compound as a photosensitive substance, and this photosensitive layer is used in positive working presensitized plate, wipe-on plate and further photoresist. The said photosensitive layer containing orthoquinonediazide utilizes the Wolff rearrangement whereby orthoquinonediazide in the exposed area is converted to carboxylic acid and so the exposed area becomes soluble in an aqueous alkaline solution used as a developer.

However, if such a photosensitive layer is applied to produce a silicone overlayer type dry planographic plate consisting of a base substrate, the photosensitive layer and a silicone rubber layer overlying the photosensitive layer, the aqueous developer will not permeate into the photosensitive layer because of the presence of an extremely water-repellent silicone layer thereon, so it is impossible to effect development. To solve this problem, it is necessary to use a developer consisting mainly of an organic solvent which permeates the silicone layer. Through studies made by the present inventors it has been found that if a polar solvent such as alcohol or ketone is used as the developer, there is recognized a slight difference in solubility between exposed and unexposed area and basically, therefore, there is the possibility of developing the photosensitive layer. However, in the case of a photosensitive layer containing an orthoquinonediazide compound usually employed in positive working presensitized plate or wipe-on plate, there is given no consideration at all to such a development with an organic solvent, so even if such a photosensitive layer is overlaid with silicone rubber to constitute a dry planographic printing plate, it is difficult to effect development in a practical sense. In more particular terms, as will be shown in detail later in Comparative Examples, before the exposed area is completely removed by the developer there also is affected the unexposed area by the developer, so that the silicone layer of the portion to form non-image area partly comes off and ink adheres thereto in printing, which hinders the attainment of an exact image reproducibility. This phenomenon is specially noticeable in shadow area composed of small dots of silicone rubber layer.

It is an object of this invention to provide a negative working presensitized planographic printing plate for use in dry planography which solves the foregoing problems and which has a remarkable processability, good image reproducibility and high durability in long-run printing.

It is another object of this invention to provide an improved photosensitive layer for use in a dry planographic plate composed of a base substrate, a photosensitive layer formed thereon and a silicone rubber layer overlying the photosensitive layer directly or through an adhesive layer.

It is a further object of this invention to provide a dry planographic plate affording an improved developing speed.

Other objects of this invention will become apparent from the following description.

SUMMARY OF THE INVENTION

The objects of this invention are achieved by a negative working presensitized planographic printing plate comprising a base substrate; a photosensitive layer secured to and overlying the base substrate, said photosensitive layer containing an orthoquinonediazide compound and having a content of ethanol-soluble component not higher than 20% by weight; and a silicone rubber layer overlying the photosensitive layer through bonding component.

A dry planographic plate according to this invention is advantageous in that even if a developing solvent affording a practical developing speed is used, the photosensitive layer of unexposed area is not affected, for example, even by exposing through a negative film of 150 lines there is attained an exact reproduction of spots from high light to shadow area. Furthermore, it has a durability sufficient to withstand practical printings because the image area which receives an external force of ink in printing is the base substrate.

DETAILED DESCRIPTION OF THE INVENTION

In the dry planographic printing plate of this invention, the photosensitive layer secured to and overlying the base substrate contains an orthoquinonediazide compound and has a content of ethanol-soluble component not higher than 20% by weight, preferably not higher than 15% by weight. The orthoquinonediazide compound referred to herein has the 1,2-quinonediazide or 1,2-naphthoquinonediazide structure within the molecule and usually is used in the form of an ester or amide obtained by the reaction of its sulfonic acid derivative, e.g. orthoquinonediazide sulfochloride, and a hydroxyl- or amino group containing compound (especially a polymer). Such an orthoquinonediazide compound may be blended with a binding resin, if necessary, for the purpose of improving the film-forming property or for other purpose on condition that the content of ethanol-soluble component of the photosensitive layer is not higher than 20% by weight, preferably not higher than 15% by weight. On the other hand, photosensitive layers containing an orthoquinonediazide compound used in commercial positive working presensitized plate, wipe-on plate and photoresist, though the structure and composition thereof have scarcely been made clear, have a content of ethanol-soluble component usually ranging from 40% to 70% by weight, so are not suitable for the construction of this invention. The content of ethanol-soluble component as referred to herein is a value measured after stirring the photosensitive layer for 1 hour in an excess of ethanol under safety light and filtration through a G3 glass filter. A suitable photosensitive layer in working this invention consists essentially of naphthoquinone-1,2-diazide-5-sulfonate of novolaks with a percentage esterification of not lower than 35%, preferably from 35% to 65%. The novolaks referred to herein represent novolak type phenolic resins obtained by condensing a phenol or m-cresol with formaldehyde. Unlike diazonium salts used in the prior art, the said photosensitive layer not only has a satisfactory film-forming property, but also is very stable thermally or in direct contact with the surface of a metallic base substrate. A percentage esterification below 35% is not desirable because the content of ethanol-soluble component exceeds 20% by weight and, therefore, the resistance to developer of unexposed photosensitive layer is deteriorated. On the other hand, if the percentage esterification exceeds 65% by weight, the developing speed of the exposed area or the film-forming property of the photosensitive layer becomes inferior, though there is no essential problem in point of the resistance to developing solvent of unexposed area.

The photosensitive layer is preferably 0.5 to 5μ thick. Too large thickness is disadvantageous from the economical point of view, while too small thickness allows easy production of pinholes in the photosensitive layer.

Into the photosensitive layer there may be added a dye for making image visible in development. Oil dyes and basic dyes are suitable, e.g. "C.I. Solvent Green 3," "C.I. Solvent Blue 25," "C.I. Solvent Red 27," and Crystal Violet. For making image visible at the time of exposure, the addition of pH-indicator, leuco-pigment or spiropyran compound is preferred.

The thickness of the silicone rubber layer used in the invention is preferably in the range of 0.5–10μ. Too small thickness causes inferior durability in printing, while too large thickness is disadvantageous from the economical point of view and also gives difficulty of removing silicone rubber in development which leads to inferior image reproducibility.

Useful silicone rubber is obtained by sparsely cross-linking a linear diorganopolysiloxane (preferably dimethyl polysiloxane) which is a base polymer. The density of this cross-linking may be expressed by an R/Si ratio in the following formula, and in useful silicone rubber, such density is within the range of 1.95–2.10, preferably 1.99–2.01. A representative silicone base polymer has the following repeating unit

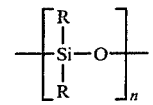

wherein n is an integer not less than 2, the R moieties being the same or not, each individual R being alkyl, halogenated alkyl, vinyl, aryl or cyanoalkyl group having 1–10 carbon atoms, it being preferable that at least 60% of R is methyl group.

Useful silicone rubber in the invention is obtained by condensation reaction os such silicone base polymer and the following silicone cross-linking agent

  (1)

  (2)

  (3)

wherein R has the same meaning as defined above, R' is an alkyl such as methyl and ethyl and Ac is acetyl group.

In order to obtain silicone rubber by such cross-linking reaction, besides the aforesaid components, an organometallic carboxylic acid salt of a metal such as tin, zinc, cobalt or lead, for example, dibutyl tin laurate, stannic octoate or cobalt naphthenate is added.

In order to improve the tenacity of silicone rubber and obtain silicone rubber which can withstand frictional force produced during printing, it is possible to mix a filler with the silicone rubber.

The base substrate employed in the invention should be sufficiently flexible for mounting on a lithographic press and strong enough to withstand the load normally produced by the lithographic press. Representative substrates include coated paper, metals or plastics such as polyethyleneterephthalate. A further coating may be applied onto these base substrates for the prevention of halation or for other purpose.

The dry planographic printing plate of this invention is constructed as above, but usually as bonding component an adhesive layer is interposed between the photosensitive layer and the silicone rubber layer.

The said adhesive layer, which is present between the photosensitive layer and the silicone rubber layer formed thereon, functions to bond the two layers. Various adhesive layers are employable, but aminosilane layer is specially preferred, said aminosilane being represented by the general formula

$$R_m R'_n Si(OR'')_{4-m-n}$$

wherein R is unsubstituted or monosubstituted amino group-containing alkyl, R' and R" are each alkyl or aryl, m is 1 or 2 and n is 0 or 1, m+n being equal to 1 to 2. Typical of such aminosilane are γ-aminopropyl triethoxy silane and γ-[N-(2-aminoethyl)amino]propyl trimethoxy silane. The reason why aminosilane is suitable for such an adhesive layer is not always clear, but it is presumed that aminosilane not only bonds itself chemically with the upper silicone rubber layer, but also reacts with orthoquinonediazide compound in the lower photosensitive layer to create a firm bond between the two layers. Since the silicone layer is thereby bonded with the photosensitive layer through the adhesive layer firm enough for practical use in plate making and printing processes, there is obtained a printing plate having a high durability. Aminosilane is also preferable in that the reaction thereof with quinonediazide compound improves the resistance to organic solvent of the photosensitive layer in unexposed condition. Regarding the thickness of the adhesive layer, it is basically sufficient to have a thickness of monomolecular layer or more, but a value ranging from 10 mμ to 0.5μ is selected in view of the actual operation of application. Too large thickness is not only disadvantageous from the economic point of view, but also badly affects the permeation of developer to the photosensitive layer.

The provision of the aforesaid adhesive layer affords such various effects. But it has become clear that, without providing such adhesive layer, if the foregoing aminosilane is blended with a silicone rubber composition and the resulting blend is coated directly onto the photosensitive layer, there is obtained a further effect that the developing speed can be improved, in addition to the various effects referred to above. That is, if such a silicone layer containing aminosilane is used, there is attained a sufficient bonding between the photosensitive layer and the silicone layer even without the provision of an adhesive layer and a developer permeates onto the photosensitive layer more quickly because of the absence of an adhesive layer which acts as a barrier layer against the developer, so that even when the contact time between printing plate and developer is short as in the case of using a developing processor, the photosensitive layer of the exposed area dissolves easily to permit development to be carried out in an extremely satisfactory manner. The reason why aminosilane in the silicone rubber layer functions effectively as bonding component is also not always clear, but it is presumed to be because the aminosilane not only produces a chemical bond with the silicone layer but also reacts with the orthoquinonediazide component in the lower photosensitive layer to give a firm bonding between the two layers. In this case, if the photosensitive layer contains a large amount of ethanol-soluble component as in the photosensitive layers used in commercially available positive working presensitized plate, etc., the said component acts to lower the efficiency of the reaction between aminosilane and orthoquinonediazide component, so that it is difficult to attain an effective bonding between the silicone rubber layer and the photosensitive layer. On the other hand, in the photosensitive layer used in this invention, the orthoquinonediazide component exists in a highly efficient manner on the surface of the photosensitive layer, which allows an extremely small amount of aminosilane to be used for attaining an effective bonding. This fact is very important, because the silicone rubber layer does not easily allow other molecules to be dissolved and dispersed therein, so the increase in the amount of incorporated aminosilane causes cohesion and deposition of aminosilane, thus leading to loss of transparency of the silicone rubber layer and a remarkable decrease in strength (particularly scratch resistance) due to decrease in cohesive force of silicone rubber, resulting in that a silicone rubber layer having a high durability in the printing process is not obtained.

For the above reasons, the amount of aminosilane contained in the silicone rubber layer is selected in the range of from 1% to 10% by weight, more preferably from 1% to 4.5% by weight. Such a small amount of aminosilane incorporated in the silicone rubber layer allows the latter to be bonded with the photosensitive layer through the aminosilane firm enough for practical use in plate making and printing processes, without damaging the strength of the silicone rubber layer, so that there is obtained a printing plate having a high durability. Such an incorporation of aminosilane is very desirable also in that the reaction thereof with orthoquinonediazide compound improves the resistance to organic solvent of the photosensitive layer in unexposed condition.

The silicone rubber layer constructed as above and forming the surface of the dry planographic printing plate of this invention has some tackiness, which is likely to cause problems such as dust easily adheres to the layer or in the exposure step a negative film is difficult to closely contact in vacuum. Therefore, a protecting film may be laminated on the surface of the silicone rubber layer. The kind of such a protecting film is not limited if it is intended to prevent dust adhesion or damage to the plate surface during handling. In this case, the protecting film should be removed before exposure. To use a protecting film also during exposure, the film must have a transparency capable of transmitting ultraviolet rays and a thickness not larger than 100 microns, preferably not larger than 15 microns, to prevent spoiling of image fidelity in exposure. To illustrate the said protecting film, mention may be made of plastic films which satisfy the condition just mentioned above, such as polyethylene, polypropylene, polyvinyl chloride, polyvinylidene chloride, polyvinyl alcohol, polyethylene terephthalate and cellophane. These protecting films should be removed before or during development by tearing-off or dissolving.

The dry planographic printing plate of this invention is prepared in the following manner, for example. First, onto a base substrate is applied a solution of a photosensitive substance by means of a conventional coater like reverse roll coater, air knife coater or Mayerbar coater, of a rotary applicator such as a whirler, then dried, thereafter an adhesive layer if required is applied onto the so-formed photosensitive layer in the same manner and, after drying, a silicone rubber solution is applied onto the adhesive layer in the same way, then heat-treated for several minutes at a temperature usually in the range of from 100° to 120° C. to allow curing to proceed to a satisfactory extent to thereby form a silicone layer secured to the photosensitive layer. If necessary, the silicone rubber layer is then covered with a protecting film by means of a laminator or the like.

The planographic printing plate of this invention produced as described in the foregoing, is exposed to actinic light through a negative transparency closely contacted to said plate in vacuo. The light source used for this exposure step should generate abundant ultraviolet rays (light); such as mercury lamps, carbon arc lamps, xenon lamps, metal halide lamps or fluorescent lamps.

The printing plate after exposure is then immersed in a developer after removal of a protecting film if any and its surface is rubbed lightly with a soft developing pad, resulting in the photosensitive layer of the exposed area being dissolved in the developer and the corresponding portion of the upper silicone rubber layer being torn off easily leaving a base substrate. On the other hand, the photosensitive layer of unexposed area does not dissolve in the developer, so the silicone layer bonded firmly with the photosensitive layer through bonding component is not affected even when rubbed strongly with the pad and thus remains on the plate surface.

The developer which may be used in this invention must permeate the silicone layer and dissolve only exposed photosensitive layer. For example, the following polar organic solvents may be used: alcohols such as methanol and ethanol, ethers such as ethyl cellosolve and dioxane, ketones such as acetone and methyl ethyl ketone, esters such as ethyl acetate and cellosolve acetate. These polar organic solvents may be used in combination with the following organic solvents with a view to adjusting solubility or swelling silicone to improve the permeation of the developer: aliphatic hydrocarbons such as hexane, heptane, gasoline and kerosene, aromatic hydrocarbons such as toluene and xylene, halogenated hydrocarbons, e.g. trichlene. Also, water may be added to the developer with a view to enhancing the safety factor against fire, but in this case it is desired that the developer consist mainly of an organic solvent.

Working examples of this invention are given below to illustrate the invention more in detail.

EXAMPLE 1

A chemical conversion coated aluminum plate (a product of Sumitomo Light Metal Industries) was coated with a 7 wt.% dioxane solution of naphthoquinone-1,2-diazide-5-sulfonate of phenol novolak ("Sumiresin PR 50235," a product of Sumitomo Bakelite Company) with a percent esterification of 44% (determined from IR spectrum, ethanol-soluble component 9.7 wt.%) by means of a whirler, then dried at 60° C. for 3 minutes to form a 2.7$\mu$ photosensitive layer, which was then coated with a 0.5 wt.% Iso Par E (a product of Esso) solution of $\gamma$-aminopropyl triethoxy silane ("A 1100," a product of UCC) by means of the whirler, then dried at 120° C. for 30 seconds, onto which was further applied a 7% Iso Par E solution of a silicone composition having the following composition by means of the whirler, followed by heating at 120° C. for 4 minutes to allow curing to proceed, to provide a silicone rubber layer with a thickness of 2.2$\mu$:

| | |
|---|---|
| (a) Dimethyl polysiloxane (molecular weight about 80,000, hydroxyl-terminated) | 100 parts |
| (b) Ethyl triacetoxy silane | 5 parts |
| (c) Dibutyl tin diacetate | 0.2 part |

The printing plate thus obtained was exposed through a negative film having dot image of 150 lines by means of a metal halide lamp (a product of Iwasaki Electric Co.) for 60 seconds at a distance of 1 m. It was then immersed in ethanol and rubbed lightly with a non-woven fabric cotton pad ("SOF PAD," a product of Dynic corporation); as a result, the exposed area was removed easily leaving exposed surface of the chemical conversion coated aluminum plate, while the silicone rubber layer remained firmly bonded to unexposed area, to give image as an exact reproduction of the negative film.

The printing plate was attached to an offset press ("Komori Sprint 2 Color") and a printing was made using "Aqualess ST Cyan," a product of Toyo Ink Mfg. Co., without using dampening water, to yield a printed matter having a very good image reproducing 5% to 95% dots of 150 lines. Even after printing 50,000 copies, there was observed neither toning by ink on non-image area nor damage to the plate surface; the place was in a state capable of being subjected to further printing. And there was no change in image reproducibility throughout the printing period.

COMPARATIVE EXAMPLES 1, 2: Examples 2–7

Using naphthoquinone-1,2-diazide-5-sulfonate of phenol novolaks having such different percentages esterification as shown in Table 1, there were manufactured printing plates in the same manner as in Example 1.

TABLE 1

| | Percent esterification (%) | Ethanol-soluble component (%) |
|---|---|---|
| Comparative Example 1 | 20 | 57 |
| Example 2 | 29 | 28 |
| Example 2 | 35 | 18 |
| Example 3 | 44 | 10 |
| Example 4 | 50 | 8 |
| Example 5 | 62 | 7 |
| Example 6 | 68 | 5 |
| Example 7 | 72 | 5 |

Each of the printing plates thus formed was exposed through a negative film to a metal halide lamp for 60 seconds at a distance of 1 m. The plate surface was soaked in ethanol, rubbed lightly with "SOF PAD" to effect development and then inked with "Aqualess ST Black". The results of evaluation are shown in Table 2.

The evaluations given in the same table are based on the number of rubbing when the plate surface was rubbed in ethanol developer with a developing pad at a load of 50 g/cm² until a 30μ dot could be developed, that is:

| 0 to 100 times | good |
| 100 to 300 times | fairly good |
| over 300 times | bad |

TABLE 2

|  | Developing speed | Image reproducibility |
| --- | --- | --- |
| Comparative Example 1 | good | bad |
| Example 2 | good | bad |
| Example 2 | good | excellent |
| Example 3 | good | excellent |
| Example 4 | good | excellent |
| Example 5 | fairly good | excellent |
| Example 6 | bad | excellent |
| Example 7 | bad | excellent |

In Comparative Examples 1 and 2, the photosensitive layer in unexposed area was affected during development, so the shadow area was not reproduced; in the extreme case the upper silicone layer exhibited a spotted pattern and exfoliated, thus a good image reproducibility was not attained.

COMPARATIVE EXAMPLE 3

The surface of a positive presensitized plate ("SGP-N," a product of Fuji Photo Film Co.) was washed with water, dried and then coated with first aminosilane and then silicone rubber in the same manner as in Example 1 to form a printing plate. The plate was exposed through a negative film to a metal halide lamp for 60 seconds at a distance of 1 m, then subjected to development in a developer consisting of ethanol or a mixed ethanol-Iso Par E (8:2 parts by weight) solution. In both cases, the photosensitive layer in unexposed area was dissolved in the developer and a good reproducibility was not attained. The content of a ethanol-soluble component in the photosensitive layer of the "SCG-N" plate was 64%.

COMPARATIVE EXAMPLE 4

A photosensitive coating liquid for wipe-on plate ("Sun Wipe-On Positive," a product of Koyo Kagaku Co.) was diluted to double with ethyl cellosolve and applied onto an aluminum plate ground by brush by means of a whirler. Then, a printing plate was manufactured in the same manner as in Example 1. The plate thus obtained was exposed through a negative film to a metal halide lamp for 60 seconds at a distance of 1 m, then subjected to development in a mixed 1-propanol-water (3:1) solution; as a result, the dots of the silicone rubber layer in the shadow area fell off together with the photosensitive layer, so a good image reproducibility was not attained. The content of ethanol-soluble component in the wipe-on photosensitive layer was 44%.

EXAMPLE 8

A 250μ polyester film ("Lumirror," a product of Toray Industries, Incorporated) was coated with a 10 wt.% cyclohexanone solution of naphthoquinone-1,2-diazide-5-sulfonate of phenol novolak with a percent esterification of 50% (ethanol-soluble component 8%) by means of whirler, then dried at 60° C. for 3 minutes, onto which was then applied a 0.5% n-butanol solution of γ-[N-(2-aminoethyl)amino]propyl trimethoxy silane ("SH 6020," a product of Toray Silicone Company) by means of the whirler, followed by drying at 120° C. for 30 seconds, onto which was further applied the same 7% Iso Par E solution of silicone composition as that used in Example 1 by means of the whirler, followed by heating at 120° C. for 4 minutes to allow curing to proceed.

The printing plate thus obtained was exposed through a negative film to a metal halide lamp for 60 seconds at a distance of 1 m. The plate surface was developed in ethanol; as a result, the exposed area was removed easily leaving exposed surface of the polyester film, while the silicone rubber layer remained firmly bonded to unexposed area, to give image as an exact reproduction throughout the negative film.

The printing plate was attached to an offset duplicator "Davidson Dualith 700" and a printing was made without using dampening water. Even after printing 20,000 copies, there was observed neither toning by ink on non-image area nor damage to the plate surface; the plate was in a state capable of being subjected to further printing. And there was no change in image reproducibility throughout the printing period.

EXAMPLE 9

The same plate as that used in Example 4 was exposed through a negative film to a metal halide lamp for 60 seconds at a distance of 1 m, then subjected to development using different developers, the results of which are shown in Table 3 below.

TABLE 3

| Developer | Developing speed | Image reproducibility |
| --- | --- | --- |
| Acetone/Iso Par E (1/2)* | excellent | excellent |
| Ethyl cellosolve/toluene (1/1)* | excellent | excellent |
| (1/3)* | bad | — |
| Ethyl acetate | somewhat bad | good |

*by weight

EXAMPLE 10

Using naphthoquinone-1,2-diazide-5-sulfonate (ethanol-soluble component 17%) of m-cresol novolak ("Sumiliteresin PR 50904," a product of Sumitomo Bakelite Company) with a percent esterification of 40%, a printing plate was manufactured in the same manner as in Example 1.

The printing plate thus obtained was exposed through a negative film to a metal halide lamp for 60 seconds at a distance of 1 m. The plate surface was immersed in ethanol and developed by rubbing it lightly with "SOF PAD"; as a result, the exposed area was removed easily leaving exposed surface of the aluminum plate, while the silicone rubber layer remained firmly bonded to unexposed area, to give image as an exact reproduction throughout the negative film.

EXAMPLE 11

A chemical conversion coated aluminum plate (a product of Sumitomo Light Metal Industries) was coated with a 3 wt.% dioxane solution of the same naphthoquinone-1,2-diazide-5-sulfonate of phenol novolak as in Example 1 by means of a whirler, then dried to form a 1.2μ photosensitive layer. On the other hand, a 7% Iso Par E solution of the same silicone rubber composition as in Example 1 was blended with 4 wt.% based on the silicone composition of γ-aminopropyl triethoxy silane ("A 1100," a product of UCC). After stirring honogeneously, the blend thus prepared was applied onto the photosensitive layer, dried and then cured by heating at 120° C. for 4 minutes to give a 2.2μ silicone rubber layer.

The printing plate thus obtained was exposed through a negative film having dot image of 150 lines to a metal halide lamp for 60 seconds at a distance of 1 m. The plate thus exposed was then developed through a developing processor at a conveyance rate of 30 cm/min using a developer consisting of 8 parts ethanol and 2 parts Iso Par E; as a result, the exposed area was removed easily leaving exposed surface of the chemical conversion coated aluminum plate, while the silicone rubber layer remained firmly bonded to unexposed area, to give image as an exact reproduction of the negative film.

The printing plate was attached to an offset press ("Komori Sprint 2 Color") and a printing was made using "Aqualess ST Cyan," a product of Toyo Ink Mfg. Co., without using dampening water, to yield a printed matter having a good image reproducing 5% to 95% dots of 150 lines Even after printing 20,000 copies, there was obserbed neither toning by ink on non-image area nor damage to the plate surface; the plate was in a state capable of being subjected to further printing. And there was no change in image reproducibility throughout the printing period.

We claim:

1. A negative working presensitized planographic printing plate for use in dry planography which comprises a base substrate; a photosensitive layer secured to and overlying said base substrate, said photosensitive layer containing a photosensitive orthoquinone-diazide compound which is a naphthoquinone-1,2-diazide-5-sulfonate of a novolak having a percent esterification as determined by IR spectrum in the range of between 44% and 65%; and a silicone rubber layer which is a sparsely cross-linked linear diorganopolysiloxane overlying said photosensitive layer through a bonding component which is an aminosilane of the formula $R_m R'_n Si(OR'')_{4-m-n}$ where R is an unsubstituted or monosubstituted amino group containing alkyl, R' and R'' are each alkyl or aryl, m is 1 or 2 and n is 0 or 1, m+n being equal to 1 and 2.

2. The printing plate of claim 1, wherein said bonding component is, as an adhesive layer, interposed between said photosensitive layer and said silicone rubber layer.

3. The printing plate of claim 1, wherein said aminosilane is γ-aminopropyl triethoxy silane.

4. The printing plate of claim 1, wherein said aminosilane is γ-[N-(2-aminoethyl)amino]propyl trimethoxy silane.

5. The printing plate of claim 1, wherein the amount of said aminosilane contained in said silicone rubber is in the range of between 1% and 10% by weight.

6. The printing plate of claim 5, wherein the amount of said aminosilane contained in said silicone rubber is in the range of between 1% and 4.5% by weight.

* * * * *